United States Patent [19]

Kotani

[11] Patent Number: 4,985,843
[45] Date of Patent: Jan. 15, 1991

[54] DIGITAL LOCATOR

[75] Inventor: Genzaburou Kotani, Kobe, Japan

[73] Assignee: Mitsubishi Denki Kabushiki Kaisha, Tokyo, Japan

[21] Appl. No.: 453,197

[22] Filed: Dec. 26, 1989

Related U.S. Application Data

[63] Continuation of Ser. No. 152,865, Feb. 5, 1988, abandoned.

[30] Foreign Application Priority Data

Mar. 3, 1987 [JP] Japan .................................. 62-49421
Mar. 3, 1987 [JP] Japan .................................. 62-49422

[51] Int. Cl.⁵ ...................... G01R 19/00; G06F 15/56
[52] U.S. Cl. .................................... 364/483; 324/522; 364/492
[58] Field of Search .................................. 364/481–483, 364/492, 733; 324/509, 521, 522, 525; 361/79, 80

[56] References Cited

U.S. PATENT DOCUMENTS

| | | | |
|---|---|---|---|
| 3,983,377 | 9/1976 | Vitins | 364/581 |
| 4,107,778 | 8/1978 | Nii et al. | 364/492 |
| 4,344,143 | 8/1982 | Kurosawa et al. | 364/492 |
| 4,459,545 | 7/1984 | Maeda | 324/521 |
| 4,577,254 | 3/1986 | Yamaura | 364/482 |
| 4,731,689 | 3/1988 | Nimmersjo et al. | 364/483 |

FOREIGN PATENT DOCUMENTS

| | | |
|---|---|---|
| 0214483 | 3/1987 | European Pat. Off. |
| 1538421 | 2/1970 | Fed. Rep. of Germany |
| 2485741 | 12/1981 | France |
| 60-39312 | 3/1985 | Japan |
| 62-40019 | 2/1987 | Japan |

Primary Examiner—Kevin J. Teska
Attorney, Agent, or Firm—Burns, Doane, Swecker & Mathis

[57] ABSTRACT

A digital locator in which a resistance value R and an inductance value L are determined using an improved approximation which remains precise over a wider frequency range based on waveform sampling at an odd or even number of time intervals.

2 Claims, 7 Drawing Sheets

DIGITAL LOCATOR

This application is a continuation of application Ser. No. 152,865, filed Feb. 5, 1988, abandoned.

BACKGROUND OF THE INVENTION

1. Field of the Invention

The present invention relates to a digital locator which is applicable to location fault point of power system.

2. Description of the Prior Art

First, constitution of a conventional locator and the principle of detecting of a fault point using this locator are described below.

Figure 1:
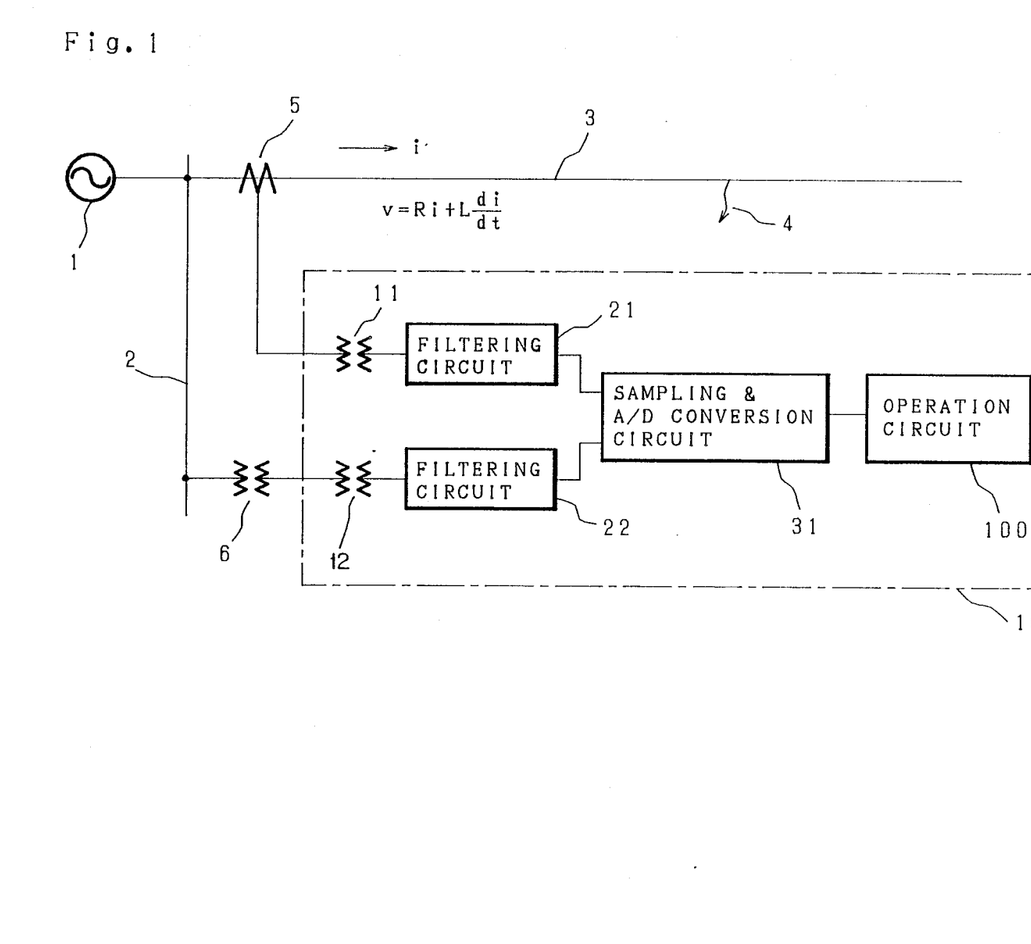
FIG. 1 is the simplified block diagram of a power system to which the digital locator related to the invention is applicable.

FIG. 1 is the simplified block diagram of a power system to which the digital locator related to the invention is applicable. The power system connected with the digital type locator is comprised of the a following; generator 1, bus 2, transmission line 3, fault point 4, current transformer 5, potential transformer 6, digital locator 10, a current transformer 11 which converts the output of the current transformer 5 into an adequate value, a voltage transformer 12 which converts the output of the potential transformer 6 into an adequate value, filtering circuits 21 and 22 which respectively eliminate restricted frequency bands, a circuit 31 which samples AC input current at constant intervals before sequentially A-D converting it into digital values, and operation circuit 100. The reference numeral 4 denotes the fault point in the power system.

In conjunction with means for operating a digital type locator, bus voltage v can be calculated by applying an equation shown below.

$$v = Ri + L\frac{di}{dt} \quad (1\text{-}1)$$

where R represents the resistance value of the transmission line up to the position where the fault point is present, L the inductance value, and i is the fault current, respectively. Based on the equation shown above, both of the following equations can be established, which respectively denote two constant time units being different from each other.

$$\int_{t_{n-1}}^{t_{n+1}} v\, dt = R\int_{t_{n-1}}^{t_{n+1}} i\, dt + L[i]_{t_{n-1}}^{t_{n+1}} \quad (1\text{-}2)$$

$$\int_{t_n}^{t_{n+2}} v\, dt = R\int_{t_n}^{t_{n+2}} i\, dt + L[i]_{t_n}^{t_{n+2}} \quad (1\text{-}3)$$

It is conventionally known that the resistance value R and the inductance value L can respectively be determined by working out a simultaneous equation derived from the above integrated equations.

When executing operations using any digital type locator, it is necessary for the locator to determine the approximation by applying discrete values produced from sampling of the integrated values at constant timewise intervals. Consequently, the applied approximation generates specific frequency characteristic, which in turn causes error to easily occur. To improve frequency characteristic generated by the approximation, a preceding art in conjunction with Japanese Patent Laid-Open No. 62-40019 (1987) proposes an invention titled by "Digital Distance Relay".

This preceding invention provides means for approximating the integrated value of current by applying the integration shown below, in which current values are denoted to be i(n), i(n+1), and i(n+2) after continuously sampling those current values at constant sampling intervals between times $t_n$, $t_{n+1}$ and $t_{n+2}$, respectively, $$\int_{t_n}^{t_{n+2}} i\, dt \approx T\left[k_1\left(\frac{i(n)}{2} + i(n+1) + \frac{i(n+2)}{2}\right) + k_2\{i(n) + i(n+2)\}\right]$$

However, since the integrated value is approximated by applying the integration shown above, error significantly grows in higher frequency bands.

SUMMARY OF THE INVENTION

A first object of this invention is to thoroughly solve those problems mentioned above by providing a novel digital type locator which is capable of securely improving a frequency characteristic throughout entire higher frequency bands.

Basically, the digital locator related to the invention determines the resistance value R and the inductance valve L by working out a simultaneous equation derived from those preceding equations (1-2) and (1-3) produced by integration of equation (1-1) which denotes the condition of the transmission line from the time $t_{n-1}$ to $t_{n+1}$ and from $t_n$ to $t_{n+2}$, respectively. When determining those values R and L, the apparatus related to the invention applies a constant sampling amount corresponding to an odd number and then executes integration by multiplying error present in higher frequency by corrective coefficient before eventually determining the approximation, thus securely improving the frequency characteristic at higher frequencies.

The above and further objects and features of the invention will more fully be apparent from the following detailed description with accompanying drawings.

BRIEF DESCRIPTION OF THE DRAWINGS

FIGS. 3 and 7 are respectively schematic charts denoting the summary of the approximate integration of fundamental wave components;

FIGS. 4 and 8 are respectively schematic charts denoting the summary of the approximate integration of double frequency components;

FIGS. 5, 9 and 10 are respectively schematic charts explaining the principle of the approximate integration;

FIGS. 6 and 11 are respectively schematic charts denoting a frequency characteristic generated from the approximate integration, in which the reference numeral 200 denotes the frequency characteristic of a conventional apparatus, whereas the reference numerals 300, 400 and 500 respectively denote frequency characteristics of the digital locator related to the invention.

DESCRIPTION OF THE PREFERRED EMBODIMENTS

Referring now more particularly to the accompanying drawings, preferred embodiments of the digital locator related to the invention are described below.

It should be understood that the present invention substantially includes the first embodiment of the invention using odd number of sampled amount and the second embodiment of the invention using even number of sampled amount, respectively.

First, the first invention is described below.

The operation circuit 100 shown in FIG. 1 is made of a microprocessor for example, which can eliminate errors from higher harmonics by computing the equation (1-4) shown below so that the object of the invention can be fulfilled.

$$R = \frac{AB - CD}{\Delta} \qquad (1\text{-}4)$$

$$L = \frac{CE - AF}{\Delta}$$

in which numerators A through F respectively denote the following relationships, $$\int_{t_{n-1}}^{t_{n+1}} v\, dt \approx \frac{K_1\theta}{2}\{v(n-1) + 2v(n) + v(n+1)\} +$$

$$\sum_{l=1}^{n} K_{l+1}l\theta\{v(n+l) + v(n-l)\}$$

$$= A$$

$$i(n+2) - i(n) = B$$

$$\int_{t_n}^{t_{n+2}} v\, dt \approx \frac{K_1\theta}{2}\{v(n) + 2v(n+1) + v(n+2)\} +$$

$$\sum_{l=1}^{n} K_{l+1}l\theta \times \{v(n+l+1) +$$

$$v(n-l+1)\}$$

$$= C$$

$$i(n+1) - i(n-1) = D$$

$$\int_{t_{n-1}}^{t_{n+1}} i\, dt \approx \frac{K_1\theta}{2}\{i(n-1) + 2i(n) + i(n+1)\} +$$

$$\sum_{l=1}^{n} K_{l+1}l\theta \times \{i(n+l) + i(n-l)\}$$

$$= E$$

$$\int_{t_n}^{t_{n+2}} i\, dt \approx \frac{K_1\theta}{2}\{i(n) + 2i(n+1) + i(n+2)\} +$$

$$\sum_{l=1}^{n} K_{l+1}l\theta \times$$

$$\{i(n+l+1) + i(n-l+1)\}$$

$$= F$$

and $\Delta = EB - FD$

Figure 2:
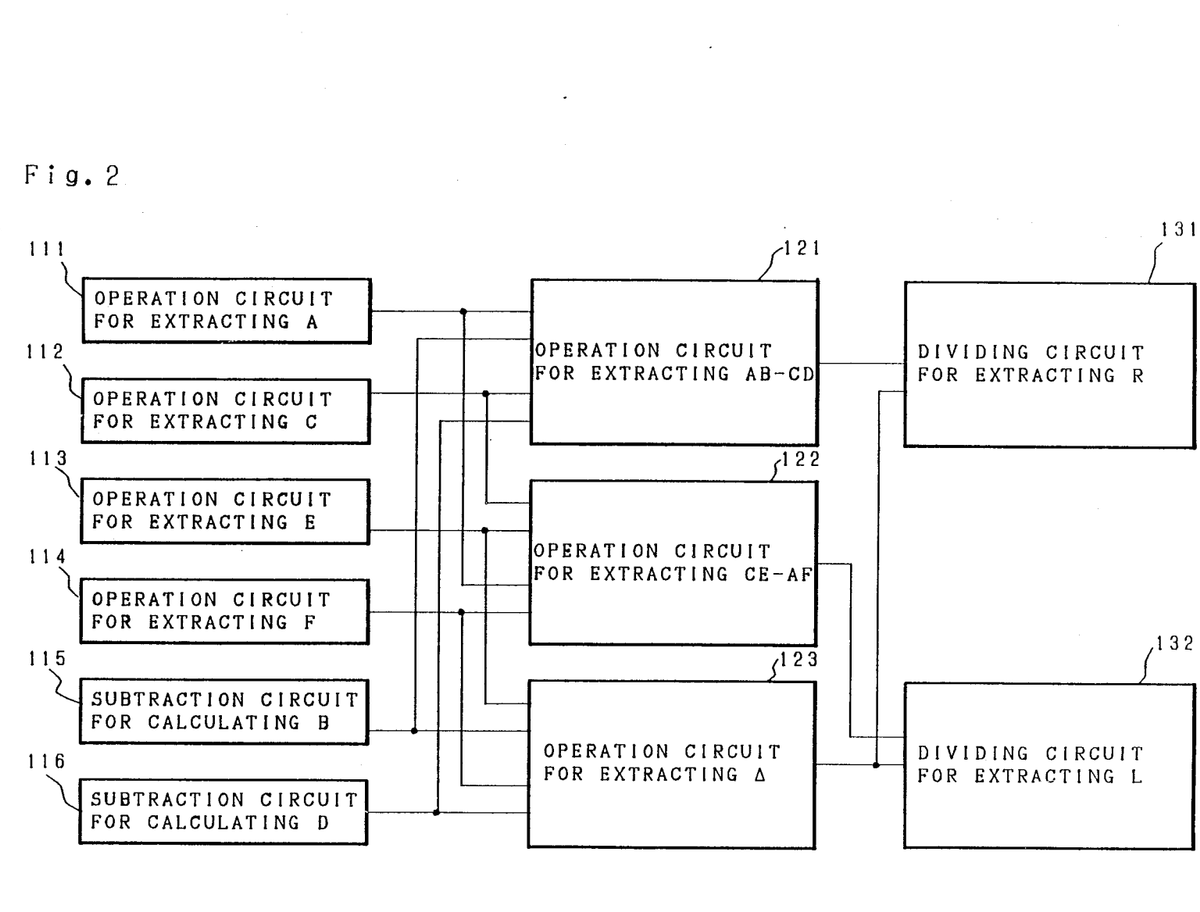
FIG. 2 is the simplified block diagram denoting the constitution of the digital locator related to the invention for explaining functional operations.

FIG. 2 is the simplified block diagram denoting the constitution of a preferred embodiment of the apparatus related to the invention for explaining the functional operations of the operation circuit 100, which is comprised of the following circuits; circuits 111 through 114 which respectively extract the substance of approximate integrations, in which the circuit 111 extracts the expression A, circuit 112 the expression C, circuit 113 the expression E, and circuit 114 extracts the expression F. Subtraction circuits 115 and 116 respectively calculate expressions B and D. The operation circuit 121 calculates $AB-CD$, operation circuit 122 calculates $CE-AF$, and the operation circuit 123 calculates $\Delta$. Division circuits 131 and 132 respectively extract resistance components R and inductance components L up to the fault point.

As described later on, since the digital locator produces an integrated value of current and voltage, the method of determining the integrated value of current and voltage by applying digital amount is described below.

Figure 3:
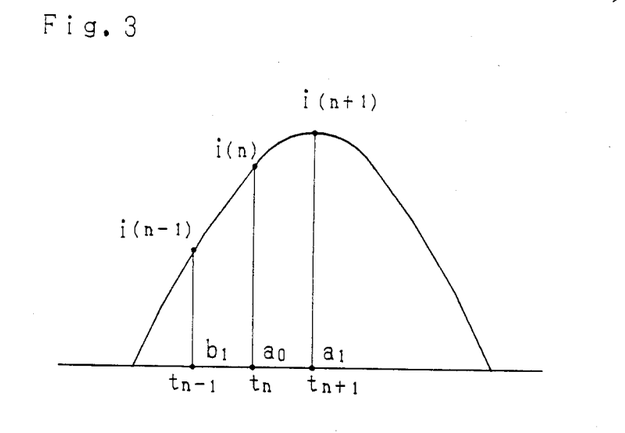
FIGS. 3 through 6 are respectively charts explaining a features according to a digital locator of the first embodiment of the invention.

FIG. 3 denotes a sine wave having a single frequency, in which i is denoted by an equation $i = \sin(\omega t + \beta)$. The $\beta$ denotes the phase angle against the voltage vector (not shown). $i(n-2)$, $i(n)$, and $i(n+1)$ are respectively the values extracted by sampling operation done by applying momentary values of current i at times $t_{n-1}$, $t_n$ and $t_{n+1}$.

When equal intervals are provided between sampling times $t_{n-1}$, $t_n$ and $t_{n+1}$ at angle $\theta$, integrated approximate value of current i up to time $t_{n+1}$ can easily be calculated by applying the area of square surrounded by $b_1-i(n-1)-i(n+1)-a_1$.

Figure 4:
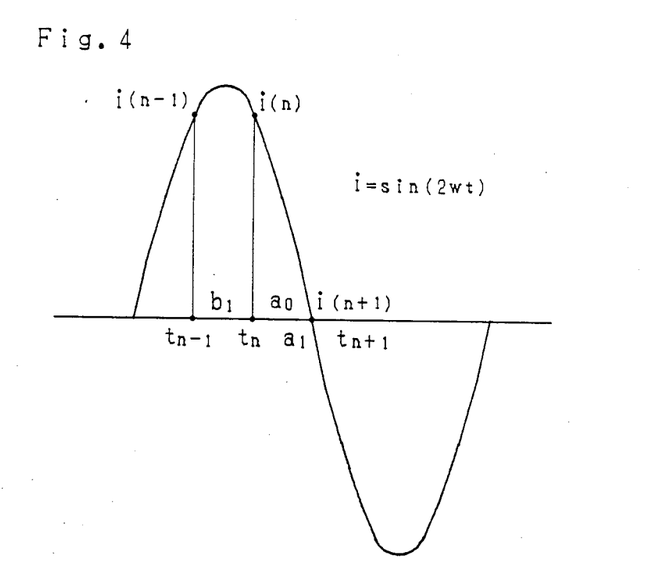

A variety of harmonics are generated when the power system is out of order, and thus, the calculated integration values should approximate with each other. However, as shown in FIG. 4, if there is a frequency which doubles the frequency components shown in FIG. 3, the area of the rectangle surrounded by $b_1$, $i(n-1)$, $i(n+1)$ and $a_1$ contains more errors than the true value shown in FIG. 4. Thus, it is considered likely that provision of short sampling intervals constrains the growth of errors.

Concretely, more errors can be reduced more than in the method considered before by adding the area of a square surrounded by $b_1-i(n-1)-i(n)-a_0$ to the area of another square surrounded by $a_0-i(n)-i(n+1)-a_1$ by applying an intermediate sampled value.

Nevertheless, even though the above method may effectively be applied, a certain error is still present at higher frequencies. Although there is an idea for shortening the sampling intervals furthermore, there is a certain limit in doing so. To effectively solve this problem, the first embodiment of the invention provides a method of minimizing error components up to higher harmonic bands by applying more sampled values corresponding to odd number rather than merely adjusting the sampling intervals. This novel method is described below.

In reference to FIG. 3, when calculating the integrated value as the sampling interval $\theta$ at times $t_{n-1}$ through $t_{n+1}$, the true value I is expressed by the equation (1-5) shown below.

$$I = \int_{\omega t + (n - 1)\theta}^{\omega t + (n + 1)\theta} \sin(\omega t + \beta)d(\omega t) = [-\cos(\omega t + \beta)]_{\omega t + (n - 1)\theta}^{\omega t + (n + 1)\theta}$$

$$= \cos\{\omega t + (n - 1)\theta + \beta\} - \cos\{\omega t + (n + 1)\theta + \beta\}$$

in which since $$\cos A - \cos B = -2\sin\left(\frac{A + B}{2}\right)\sin\left(\frac{A - B}{2}\right) \quad (1\text{-}5)$$

$$I = 2 \sin(\omega t + n\theta + \beta)\sin\theta$$

Next, the following equation (1-6) can be established by designating the integrated approximate value to be S.

$$\begin{aligned} S &= \text{area of square } b_1 - i(n - 1) - i(n) - a_0 + \\ &\quad \text{area of square } a_0 - i(n) - i(n + 1) - a_1 \\ &= \frac{\theta}{2} \{i(n - 1) + i(n)\} + \frac{\theta}{2} \{i(n) + i(n + 1)\} \\ &= \frac{\theta}{2} \{i(n - 1) + 2i(n) + i(n + 1)\} \end{aligned} \quad (1\text{-}6)$$

where $i(n-1)$, $i(n)$, and $i(n+1)$ are respectively in the relationships shown below.

$$i(n-1) = \sin\{\omega t + \beta + (n-1)\theta\}$$

$$i(n) = \sin\{\omega t + \beta + n\theta\}$$

$$i(n+1) = \sin\{\omega t + \beta + (n+1)\theta\}$$

Substitution of these equations into the equation (1-6) results in the equation (1-7) based on the following equation.

$$S = \frac{\theta}{2} [\sin\{\omega t + \beta + (n - 1)\theta\} + 2\sin(\omega t + \beta + n\theta) + \sin\{\omega t + \beta + (n + 1)\theta\}] \quad (1\text{-}7)$$

$$\sin A + \sin B = 2\sin\left(\frac{A + B}{2}\right)\cos\left(\frac{A - B}{2}\right)$$

$$S = \theta\{\sin(\omega t + \beta + n\theta)\cos\theta + \sin(\omega t + \beta + n\theta)\}$$

$$= \theta\sin(\omega t + \beta + n\theta)(1 + \cos\theta)$$

Next, when designating the integrated approximation to be Sc after correction by multiplying the equation (1-7) by coefficient C in order that the approximation calculated by the above equation (1-7) can exactly be equal to the true value I calculated by the equation (1-5), the relationship of Sc can be expressed by the equation (1-8) shown below.

$$Sc = C\theta \sin(\omega t + \beta + n\theta)(1 + \cos\theta) \quad (1\text{-}8)$$

As a result, it is clear that the coefficient C being the multiplier needed for converting the approximation into the true value I from the above equations (1-5) and (1-8) can be expressed by the equation shown below.

$$C = \frac{2\sin\theta}{\theta(1 + \cos\theta)} \quad (1\text{-}9)$$

However, in an approximate integral equation multiplied by correction when considering the case in which higher harmonic being m-times higher than the frequency may be applied to the power system, the corrected approximate integration should be expressed by the equation shown below by multiplying the equation (1-6) by C.

$$S = \frac{C\theta}{2} \{i(n - 1) + 2i(n) + i(n + 1)\}$$

Since the momentary values of i are respectively expressed by those equations shown below, $$i(n-1) = \sin\{m\omega t + \beta + (n-1)m\theta\}$$

$$i(n) = \sin(m\omega t + \beta + nm\theta)$$

$$i(n+1) = \sin\{m\omega t + \beta + (n+1)m\theta\}$$

the equation (1-10) can be established as shown below in accordance with those equations shown above.

$$\begin{aligned} S &= \frac{C\theta}{2} [\sin\{m\omega t + \beta + (n - 1)m\theta\}] + 2\sin(m\omega t + \beta + nm\theta) + \sin\{m\omega t + \beta + (n + 1)\theta\} \\ &= C\theta\sin(m\omega t + \beta + nm\theta)\{1 + \cos(m\theta)\} \end{aligned} \quad (1\text{-}10)$$

Then, the equation (1-11) can be established by substituting the preceding equation (1-9) into the corrective coefficient C.

$$S = \frac{2\sin\theta}{1 + \cos\theta} \sin(m\omega t + \beta + nm\theta)\{1 + \cos(m\theta)\} \quad (1\text{-}11)$$

As was done by the preceding equation (1-5), the true value I of the integrated value is then developed into the relationship expressed in the equation (1-12) shown below.

$$\begin{aligned} I &= \int_{\omega t + (n - 1)\theta}^{\omega t + (n + 1)\theta} \sin(m\omega t + \beta)d(\omega t) \\ &= \left[-\frac{1}{m}\cos(m\omega t + \beta)\right]_{\omega t + (n - 1)\theta}^{\omega t + (n + 1)\theta} \\ &= \frac{1}{m} [\cos\{m\omega t + \beta + m(n - 1)\theta\} - \cos\{m\omega t + \beta + m(n + 1)\theta\}] \\ &= \frac{2}{m} \sin(m\omega t + \beta + nm\theta)\sin(m\theta) \end{aligned} \quad (1\text{-}12)$$

Consequently, in reference to those equations (1-11) and (1-12) shown above, the errors can be expressed by the equation (1-13) shown below.

$$\frac{S-I}{I} = m\frac{\sin\theta}{\sin(m\theta)} \cdot \frac{1 + \cos(m\theta)}{1 + \cos\theta} - 1 \quad (1\text{-}13)$$

This indicates that a certain amount of error can still be generated in the m-degrees harmonic waves even after multiplying the corrective coefficient C.

Figure 5:
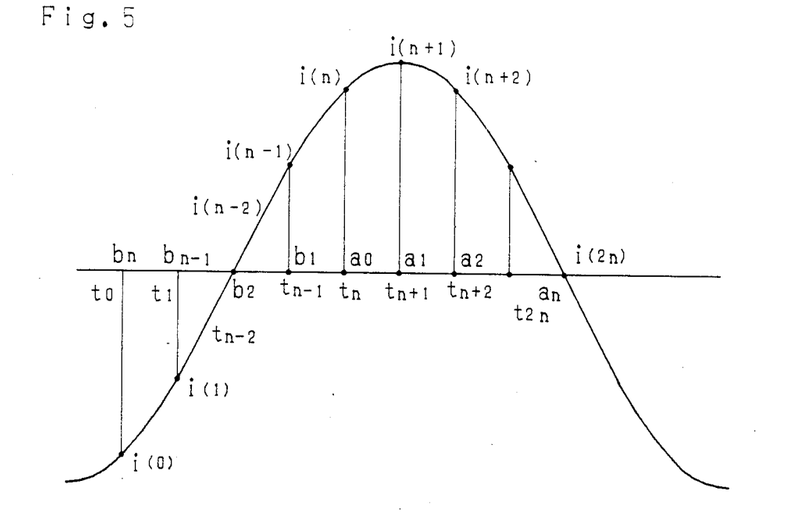

To thoroughly eliminate even the slightest error, as shown in FIG. 5, the first invention provides a polynomial expression using approximate integrating expressions by applying odd number of sampled values without varying sampling intervals on condition that the applicable odd number should fully satisfy (the odd-number $\times \theta < 2\pi$), while multiplying each term by corrective coefficient by applying a specific frequency so that the amount of error can eventually be reduced to zero.

More particularly, in reference to FIG. 5, the areas of two squares surrounded by $b_1 - i(n-1) - i(n) - a_0$ and $a_0 - i(n) - i(n+1) - a_1$ are added together to make up a term, which is then, multiplied by corrective a coefficient $K_1$ so that no error can be present in the frequency of the fundamental wave for example, thus allowing the following equation to be provided as was done by the preceding equation (1-6).

$$S_0 = \frac{K_1\theta}{2}\{i(n-1) + 2i(n) + i(n+1)\}$$

Next, the area of a square $b_1 - i(n-1) - i(n+1) - a_1$ is multiplied by corrective coefficient $K_2$ so that no error can be present in double frequency for example, thus allowing the following equation to be provided.

$$S_1 = K_2\theta\{i(n-1) + i(n+1)\}$$

Furthermore, another square $b_2 - i(n-2) - i(n+2) - a_2$ is multiplied by corrective coefficient $K_3$ so that no error can be present in a specific frequency, thus allowing the following equation to be provided.

$$S_2 = 2K_3\theta\{i(n-2) + i(n+2)\}$$

In the same manner as above, the following equations are provided before eventually making up an approximate integrating expression by summing up these equations.

$$S_{n-1} = K_n(n-1)\theta\{i(1) + i(2n-1)\}$$

$$S_n = K_{n+1}n\theta\{i(0) + i(2n)\}$$

The sum of these is expressed by the equation shown below.

$$\begin{aligned} S_T &= S_0 + \sum_{n=1}^{n} S_n \quad (1\text{-}14)\\ &= \frac{K_1\theta}{2}\{i(n-1) + 2i(n) + i(n+1)\} + \\ &\quad \sum_{l=1}^{n} K_{l+1}l\theta \times \{i(n-l) + i(n+l)\} \end{aligned}$$

Next, the method of calculating the corrective coefficient applicable to the above equations is described below. Assume that the current waveform is comprised of m-degrees higher harmonics and has a momentary value of current i at time $t_0$ as shown below;

$$i(0) = \sin(m\omega t + \beta)$$

then, the momentary value of current i develops into the relationship shown below.

$$\begin{aligned} i(1) &= \sin(m\omega t + \beta + m\theta)\\ i(2) &= \sin(m\omega t + \beta + 2m\theta)\\ &\vdots\\ i(n-1) &= \sin\{m\omega t + \beta + (n-1)m\theta\}\\ i(n) &= \sin(m\omega t + \beta + nm\theta)\\ i(n+1) &= \sin\{m\omega t + \beta + (n+1)m\theta\}\\ &\vdots\\ i(2n-2) &= \sin\{m\omega t + \beta + (2n-2)m\theta\}\\ i(2n-1) &= \sin\{m\omega t + \beta + (2n-1)m\theta\}\\ i(2n) &= \sin(m\omega t + \beta + 2nm\theta) \end{aligned}$$

By substituting those values into the preceding equation (1-14), the equation (1-15) can be formed as shown below.

$$\begin{aligned} S_T &= K_1\theta\sin(m\omega t + \beta + nm\theta)\{1 + \cos(m\theta)\} + \quad (1\text{-}15)\\ &\quad 2K_2\theta\sin(m\omega t + \beta + nm\theta)\cos(m\theta) + \\ &\quad 4K_3\theta\sin(m\omega t + \beta + nm\theta)\cos(2m\theta) + \\ &\quad \vdots\\ &\quad 2(n-1)K_n\theta\sin(m\omega t + \beta + nm\theta)\cos\{(n-1)m\theta\} + \\ &\quad 2nK_{n+1}\theta\sin(m\omega t + \beta + nm\theta)\cos(nm\theta)\\ &= \theta\sin(m\omega t + \beta + nm\theta)[K_1\{1 + \cos(m\theta)\} + \\ &\quad 2K_2\cos(m\theta) + \\ &\quad 4K_3\cos(2m\theta) + \ldots 2(n-1)K_n\cos\{(n-1)m\theta\} + \\ &\quad 2nK_{n+1}\cos(nm\theta)] \end{aligned}$$

On the other hand, the integrated value of the true value I is expressed by the equation shown below.

$$\begin{aligned} I &= \int_{\omega t + (n-1)\theta}^{\omega t + (n+1)\theta} \sin(m\omega t + \beta)d(\omega t) \quad (1\text{-}16)\\ &= \left[-\frac{1}{m}\cos(m\omega t + \beta)\right]_{\omega t + (n-1)\theta}^{\omega t + (n+1)\theta}\\ &= \frac{1}{m}[\cos\{m\omega t + \beta + (n-1)m\theta\} - \cos\{m\omega t + \beta + (n+1)m\theta\}]\\ &= \frac{2}{m}\sin(m\omega t + \beta + nm\theta)\sin(m\theta) \end{aligned}$$

Accordingly, corrective coefficients for equalizing the integrated approximate value $S_T$ and the true value I can be determined by converting equations (1-15) and (1-16) into an identical equation, which is expressed in the following equation (1-17) after deleting similar terms.

$$\theta K_1\{1 + \cos(m\theta)\} + 2\theta K_2\cos(m\theta) + 4\theta K_3\cos(2m\theta) + \ldots \quad (1\text{-}17)$$
$$+$$
$$2\theta(n-2)K_n\cos\{(n-1)m\theta\} + 2\theta_n K_{n+1}\cos(nm\theta) = \frac{2}{m}\sin(m\theta)$$

The corrective coefficient can eventually be determined by working out the simultaneous equation derived from the above equation (1-17) to allow no error to be present in a specific frequency. For example, if the entire amount of error is perfectly eliminated from the fundamental wave and double frequency by applying those values samples from 3 points, since these sampling points are substantially $b_1$, $a_0$ and $a_1$, $n=1$ can be substituted into n of the equation (1-17).

When substituting $m=1$ into the equation (1-17) for eliminating error components from the fundamental wave, the following expression can be provided.

$$\theta K_1(1+\cos\theta)+2\theta K_2 \cos\theta = 2\sin\theta$$

Likewise, when substituting $m=2$ into the equation (1-17) for eliminating errors from double frequency, the following expression can be provided.

$$\theta K_1\{1+\cos(2\theta)\}+2\theta K_2 \cos(2\theta) = \sin(2\theta)$$

Consequently, values of corrective coefficients $K_1$ and $K_2$ can respectively be determined by working out the determinants shown below.

$$\begin{bmatrix} \theta(1+\cos\theta) & 2\theta\cos\theta \\ \theta\{1+\cos(2\theta)\} & 2\theta\cos(2\theta) \end{bmatrix} \begin{bmatrix} K_1 \\ K_2 \end{bmatrix} = \begin{bmatrix} 2\sin\theta \\ 2\sin(2\theta) \end{bmatrix}$$

Figure 6:
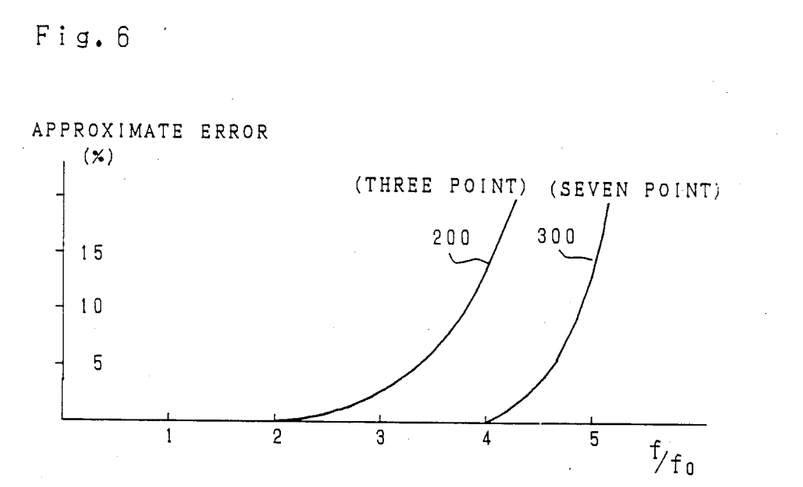

FIG. 6 denotes the frequency characteristic curve 200 which represents approximate error percentage against the true value in the vertical axis and the rate of degree $f/f_0$ between harmonics waves f and the fundamental wave frequency $f_0$ in the horizontal axis after substituting the corrective coefficients $K_1$ and $K_2$ into the approximate integration of the equation (1-14) following the calculation of these corrective coefficients by executing a 3-point sampling operation at 30° of sampling intervals $\theta$. The method of executing the 3-point sampling operation is conventionally known.

The present invention allows the number of sampling operation to be increased by applying odd-number sampling points like 5 or 7 points for example so that errors can perfectly be eliminated from extensive frequencies including higher harmonic bands.

For example, when executing a 7-point sampling operation, since these sampling points are substantially comprised of $b_3$ through $b_1$ and $a_0$ through $a_3$, $n=3$ is substituted into n of the equation (1-17). Assume that no error is present in the fundamental wave, double frequency, triple frequency, and the quadruple frequency, respectively, then the corrective coefficients $K_1$ through $K_4$ can be calculated by working out simultaneous equations derived from the following four expressions.

Concretely, when dealing with the fundamental wave, the following expression is generated by substituting $m=1$ into the preceding expression (1-17).

$$\theta K_1(1+\cos\theta)+2\theta K_2 \cos\theta+4\theta K_3 \cos(2\theta)+6\theta K_4 \cos(3\theta)=2\sin(\theta)$$

Next, when dealing with a double-frequency, $m=2$ is substituted into the preceding equation (1-17), thus generating the expression shown below.

$$\theta K_1\{1+\cos(2\theta)\}+2\theta K_2 \cos(2\theta)+4\theta K_3 \cos(4\theta)+6\theta K_4 \cos(6\theta)=\sin(2\theta)$$

When dealing with a triple-frequency, $m=3$ is substituted into the preceding equation (1-17), thus generating the expression shown below.

$$\theta K_1\{1+\cos(3\theta)\}+2\theta K_2\cos(3\theta)+4\theta K_3\cos(6\theta)+$$

$$6\theta K_4\cos(9\theta)=\frac{2}{3}\sin(3\theta)$$

Likewise, when dealing with a quadruple-frequency, $m=4$ is substituted into the preceding equation (1-17), thus generating the expression shown below.

$$\theta K_1\{1+\cos(4\theta)\}+2\theta K_2\cos(4\theta)+4\theta K_3\cos(8\theta)+$$

$$6\theta K_4\cos(12\theta)=\frac{1}{2}\sin(4\theta)$$

Finally, those corrective coefficients $K_1$ through $K_4$ can respectively be determined by working out the following determinants derived from those expressions shown above.

$$\begin{bmatrix} \theta(1+\cos\theta) & 2\theta\cos\theta & 4\theta\cos(2\theta) & 6\theta\cos(3\theta) \\ \theta\{1+\cos(2\theta)\} & 2\theta\cos(2\theta) & 4\theta\cos(4\theta) & 6\theta\cos(6\theta) \\ \theta\{1+\cos(3\theta)\} & 2\theta\cos(3\theta) & 4\theta\cos(6\theta) & 6\theta\cos(9\theta) \\ \theta\{1+\cos(4\theta)\} & 2\theta\cos(4\theta) & 4\theta\cos(8\theta) & 6\theta\cos(12\theta) \end{bmatrix} \begin{bmatrix} K_1 \\ K_2 \\ K_3 \\ K_4 \end{bmatrix} =$$

$$\begin{bmatrix} 2\sin(\theta) \\ \sin(2\theta) \\ \frac{2}{3}\sin(3\theta) \\ \frac{1}{2}\sin(4\theta) \end{bmatrix}$$

FIG. 6 also denotes the frequency characteristic curve 300 generated from the execution of the approximate integration of the preceding equation (1-14) following the calculation of the corrective coefficients by executing a 7-point sampling operation at 30° of sampling intervals $\theta$.

The preferred embodiment of the apparatus related to the first embodiment of the invention thoroughly eliminates even the slightest amount of error from extensive frequencies including higher harmonic bands by calculating corrective coefficients in the approximate integrated equation (1-14) based on the method described above, thus eventually improving the entire frequency characteristic.

The value of the approximate integration calculated by the method mentioned above can be applied to the following integration terms derived from the simultaneous equations of the preceding equations (1-2) and (1-3) shown earlier.

$$R = \frac{\int_{t_{n-1}}^{t_{n+1}} vdt[i] \int_{t_n}^{t_{n+2}} - \int_{t_n}^{t_{n+2}} vdt[i] \int_{t_{n-1}}^{t_{n+1}}}{\Delta}$$

$$L = \frac{\int_{t_n}^{t_{n+2}} vdt \int_{t_{n-1}}^{t_{n+1}} idt - \int_{t_{n-1}}^{t_{n+1}} vdt \int_{t_n}^{t_{n+2}} idt}{\Delta}$$

where $$\Delta = \int_{t_{n-1}}^{t_{n+1}} idt[i] \int_{t_n}^{t_{n+2}} - \int_{t_n}^{t_{n+2}} idt[i] \int_{t_{n-1}}^{t_{n+1}}$$

By working out those integration terms shown above, both the resistance component R and the inductance component L up to the fault point in the power system can be determined. In other words, the digital locator related to the invention is now fully realized.

The foregoing description has solely referred to the method of integrating current. Since it is conventionally known that the integration can also be applied to voltage and the hardware employed for the preferred embodiment of the invention is identical to that of any conventional digital relay, detailed description is deleted.

Likewise, the foregoing description of the first embodiment of the invention has solely referred to method of approximately calculating the integrated values by applying the odd-number of sampled values. It should be understood however that the apparatus related to the invention also approximately calculates the integrated values by applying the even-number of sampled values by means of the second embodiment of the invention described below.

Next, referring now to the accompanying drawings, a preferred embodiment of the digital locator of the embodiment of the second invention is described below.

The operation circuit 100 shown in FIG. 1 is substantially comprised of a microcomputer for example. By allowing the operation circuit 100 to process the equation (2-1) shown below, errors present in high-harmonics can perfectly be eliminated in order that the object of the invention can be fulfilled.

$$R = \frac{AB - CD}{\Delta} \quad (2-1)$$

$$L = \frac{CE - AF}{\Delta} \quad (2-1)$$

where $$\int_{t_{n-1}}^{t_n} v\,dt \approx \frac{\theta}{2} \sum_{l=1}^{n} (2l-1) K_l \{v(n-l) + v(n+l-1)\} = A$$

$$i(n+1) - i(n) = B$$

$$\int_{t_n}^{t_{n+1}} v\,dt \approx \frac{\theta}{2} \sum_{l=1}^{n} (2l-1) K_l \{v(n-l+1) + v(n+l)\} = C$$

$$i(n) - i(n-1) = D$$

$$\int_{t_{n-1}}^{t_n} i\,dt \approx \frac{\theta}{2} \sum_{l=1}^{n} (2l-1) K_l \{i(n-l) + i(n+l-1)\} = E$$

$$\int_{t_n}^{t_{n+1}} i\,dt \approx \frac{\theta}{2} \sum_{l=1}^{n} (2l-1) K_l \{i(n-l+1) + i(n+l)\} = F$$

$$\Delta = EB - FD$$

Figure 7:
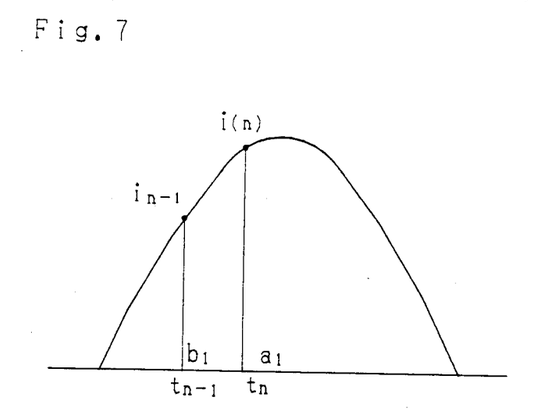
FIGS. 7 through 11 are respectively charts explaining a features according to a digital locator of the second embodiment of the invention.

FIG. 7 denotes a sine wave having a single frequency, which can be expressed by an equation $i = \sin(\omega t + \beta)$. The $\beta$ denotes the phase angle against the voltage vector (not shown). $i(n-1)$ and $i(n)$ respectively denote the values sampled by respective momentary values of current i at times $t_{n-1}$ and $t_n$.

Assume that the interval between times $t_{n-1}$ and $t_n$ for executing a sampling operation is angle $\theta$, the integrated value of current i from time $t_{n-1}$ to $t_n$ can approximately and easily be calculated by applying the method described below.

Figure 8:
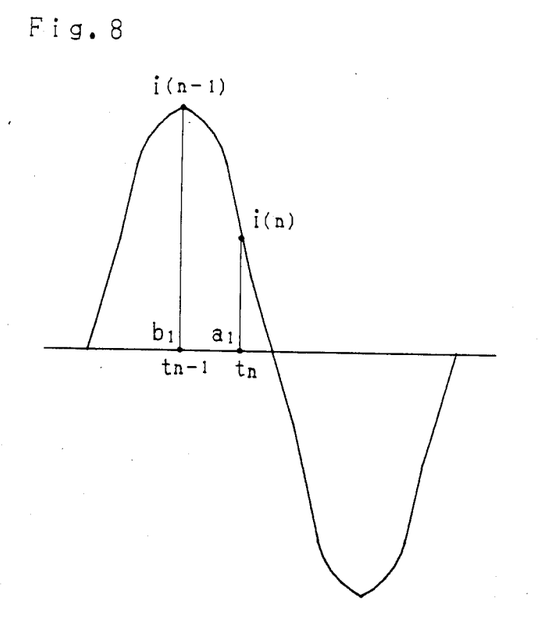

The integrated value of current i can approximately be calculated by applying the area of a square surrounded by $b_1 - i(n-1) - i(n) - a_1$. However, since a variety of high-harmonics are generated when the power system is out of order, the calculated integrated values should approximate to each other. Nevertheless, as shown in FIG. 8, when a specific frequency that doubles the frequency component shown in FIG. 7 is applied, the error component grows in the area of the above-cited square surrounded by $b_1 - i(n-1) - i(n) - a_1$ than the true value.

As a result, it is considered likely that the amount of error component can be reduced by narrowing the angle $\theta$ of the sampling interval. However, since there is a certain limit in doing so, the second embodiment of the invention hereby proposes a method of minimizing the amount of error component up to higher harmonic wave bands by effectively applying a number of the even-number sampled values rather than depending on the sampling interval.

Figure 9:
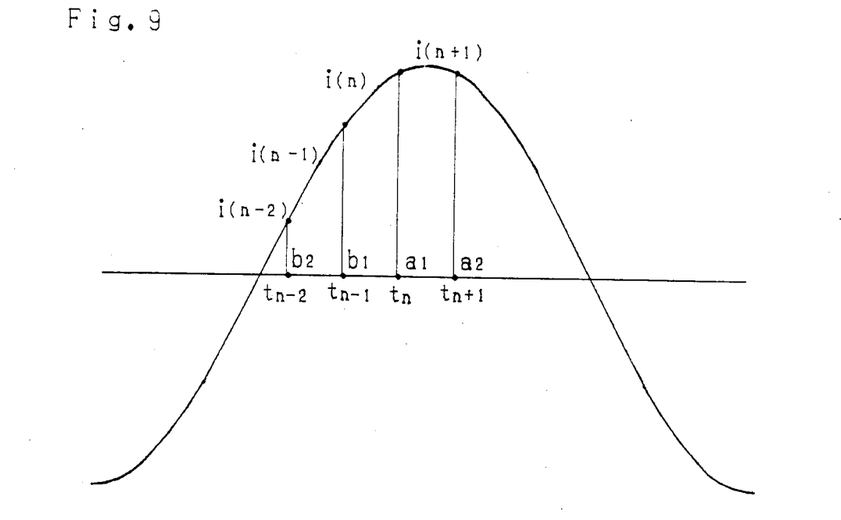

In reference to FIG. 9 as mentioned earlier, the integrated approximate value of current i from time $t_{n-1}$ to $t_n$ can be calculated by applying area S of the square surrounded by $b_1 - i(n-1) - i(n) - a_1$. The following equation denotes the multiplication of the approximate value by the corrective coefficient $K_1$ used for correcting error against the true value.

$$S = \frac{K_1 \theta}{2} \{i(n-1) + i(n)\}$$

However, if the value of the corrective coefficient $K_1$ is determined in the above equation to allow no error to be present in a specific frequency like the basic wave component, for example, error components cannot perfectly be eliminated from other frequencies like the one that doubles the basic wave frequency. Thus, in order to fully eliminate error components from other frequencies, the following equation is established by first multiplying the square area surrounded by $b_2 - i(n-2) - i(n+1) - a_2$ by the corrective coefficient $K_2$, followed by addition of the product of this multiplication to S shown in the above equation.

$$Sc = \frac{K_1 \theta}{2} \{i(n-1) + i(n)\} + \frac{3K_2 \theta}{2} \{i(n-2) + i(n+1)\}$$

Figure 10:
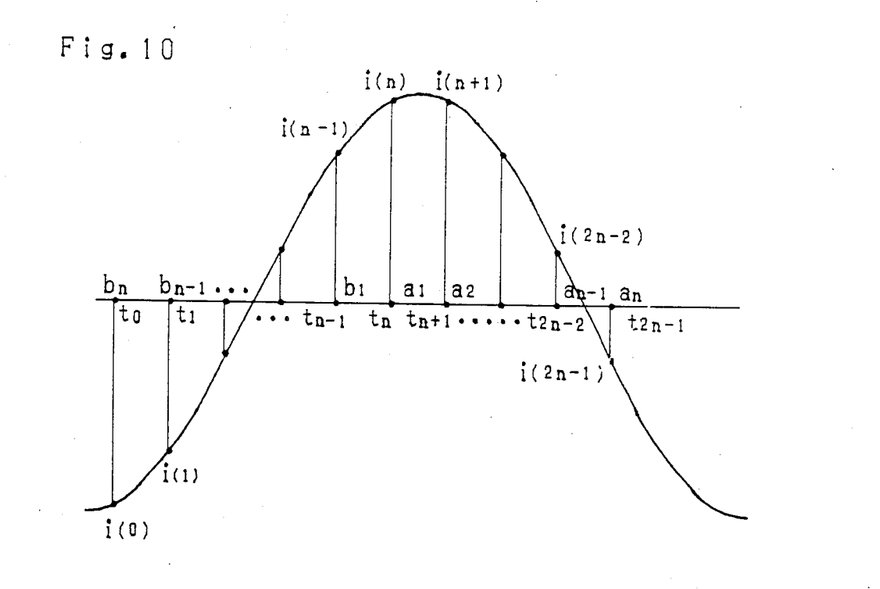

Likewise, the following equation (2-2) being the approximate integration is established by increasing the number of the sampled value as shown in FIG. 10.

$$\begin{aligned} Sc &= \frac{K_1 \theta}{2} \{i(n-1) + i(n)\} + \\ &\quad \frac{3K_2 \theta}{2} \{i(n-2) + i(n+1)\} + \\ &\quad \frac{5K_3 \theta}{2} \{i(n-3) + i(n+2)\} + \ldots + \\ &\quad \frac{(2n-1) K_n \theta}{2} \{i(0) + i(2n-1)\} \\ &= \frac{\theta}{2} \sum_{l=1}^{n} (2l-1) K_l \{i(n-l) + i(n+l-1)\} \end{aligned} \quad (2\text{-}2)$$

Next, the method of calculating the corrective coefficient in equations is described below.

Assume that the momentary value of current i having a specific waveform containing m-degree harmonic wave at time is denoted by equation;

$i(0) = \sin(m\omega t + \beta)$

Based on this equation, the following equations can respectively be established.

$i(1) = \sin(m\omega t + \beta + m\theta)$
$i(2) = \sin(m\omega t + \beta + 2m\theta)$

.
.
.

$i(n-2) = \sin\{m\omega t + \beta + (n-2)m\theta\}$
$i(n-1) = \sin\{m\omega t + \beta + (n-1)m\theta\}$
$i(n) = \sin(m\omega t + \beta + nm\theta)$
$i(n+1) = \sin\{m\omega t + \beta + (n+1)m\theta\}$

.
.
.

$i(2n-2) = \sin\{m\omega t + \beta + (2n-2)m\theta\}$
$i(2n-1) = \sin\{m\omega t + \beta + (2n-1)m\theta\}$ Substitution of these values into the above equation (2-2) allows the formation of the equation (2-3) shown below in accordance with the equation.

$$\sin A + \sin B = 2\sin\left(\frac{A+B}{2}\right)\cos\left(\frac{A-B}{2}\right)$$

$$\begin{aligned}Sc &= \theta[K_1\sin\{(m\omega t + \beta + (n-0.5)m\theta\}\cos(0.5m\theta) \\ &+ K_2\sin\{m\omega t + \beta + (n-0.5)m\theta\}\cos(1.5m\theta) \\ &\vdots \\ &+ K_{n-1}\sin\{m\omega t + \beta + (n-0.5)m\theta\}\cos\{(n-1.5)m\theta\} \\ &+ K_n\sin\{m\omega t + \beta + (n-0.5)m\theta\}\cos\{(n-0.5)m\theta\}] \\ &= \theta\sin\{m\omega t + \beta(n-0.5)m\theta\}[K_1\cos(0.5m\theta) + K_2\cos(1.5m\theta) \\ &+ \ldots + K_{n-1}\{\cos(n-1.5)m\theta \\ &+ K_n\{\cos(n-0.5)m\theta\}]\end{aligned} \quad (2\text{-}3)$$

On the other hand, the true value of integration from time $t_{n-1}$ to $t_n$ is expressed by the equation (2-4) shown below.

$$\begin{aligned}I &= \int_{\omega t + (1n-1)\theta}^{\omega t + n\theta} \sin(m\omega t + \beta)d(\omega t) \quad (2\text{-}4) \\ &= \left[-\frac{1}{m\cos}(m\omega t + \beta)\right]_{\omega t + (n-1)\theta}^{\omega t + n\theta} \\ &= \frac{1}{m}[\cos\{m\omega t + \beta + (n-1)m\theta\} - \cos\{m\omega t + \beta + nm\theta\}] \\ &= \frac{2}{m}\sin(m\omega t + \beta + (n-0.5)m\theta)\sin\left(\frac{m\theta}{2}\right)\end{aligned}$$

As a result, the corrective coefficient can be determined by converting these equations (2-3) and (2-4) into the identical equation (2-5) shown below in order that the integrated approximate value can exactly be equal to the true value. The identical equation (2-5) is established after deleting all the similar terms from those equations (2-3) and (2-4).

$$\theta[K_1\cos(0.5m\theta) + K_2\cos(1.5m\theta) + \ldots + K_n\{\cos(n-0.5)m\theta\}] = \quad (2\text{-}5)$$

$$\frac{2}{m}\sin\left(\frac{m\theta}{2}\right)$$

Next, based on the identical equation (2-5) shown above, a specific expression is established so that no error can be present in a specific frequency, and then, the corrective coefficient can eventually be determined by working out the simultaneous equation derived from this specific expression.

For example, in order to completely eliminate errors from the basic wave, a double frequency, and a triple frequency by applying 6-point sampled values, since these sampled values are comprised of 6-points including $b_3$ through $b_1$ and $a_1$ through $a_3$, respectively, $n=3$ is substituted into n of the above identical equation (2-5). Accordingly, when making up the identical equation (2-5) for dealing with the basic wave, $m=1$ is substituted into m of the expression (2-5), and as a result, the following equation is established.

$$\theta\{K_1\cos(0.5\theta) + K_2\cos(1.5\theta) + K_3\cos(2.5\theta)\} = 2\sin(0.5\theta)$$

Next, when making up the identical equation (2-5) for dealing with the double frequency, $m=2$ is substituted into m of the identical equation (2-5), and as a result, the following equation is established.

$$\theta\{K_1\cos(\theta) + K_2\cos(3\theta) + K_3\cos(5\theta)\} = \sin(\theta)$$

Likewise, when making up the identical equation (2-5) for dealing with the triple frequency, $m=3$ is substituted into m of the identical equation (2-5), and as a result, the following equation is established.

$$\theta(K_1\cos(1.5\theta) + K_2\cos(4.5\theta) + K_3\cos(7.5\theta)) = \frac{2}{3}\sin(1.5\theta)$$

As a result, values of the corrective coefficients $K_1$ through $K_3$ can respectively be determined by working out the following determinants.

$$\begin{pmatrix} \cos(0.5\theta) & \cos(1.5\theta) & \cos(2.5\theta) \\ \cos(\theta) & \cos(3\theta) & \cos(5\theta) \\ \cos(1.5\theta) & \cos(4.5\theta) & \cos(7.5\theta) \end{pmatrix} \begin{pmatrix} K_1 \\ K_2 \\ K_3 \end{pmatrix} =$$

$$\frac{1}{\theta}\begin{pmatrix} 2\sin(0.5\theta) \\ \sin(\theta) \\ \frac{2}{3}\sin(1.5\theta) \end{pmatrix}$$

Figure 11:
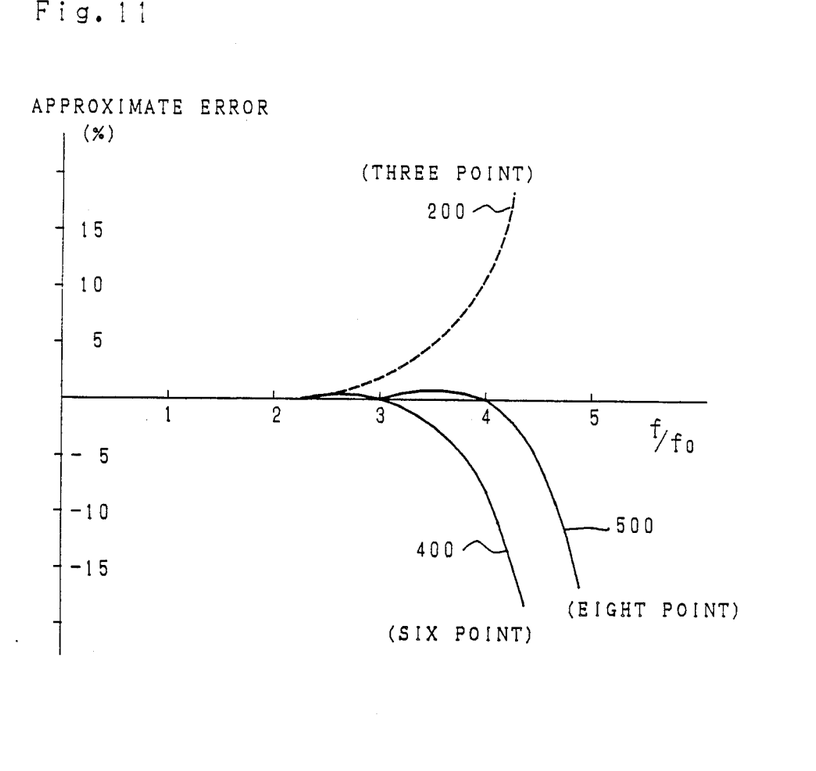

FIG. 11 denotes the frequency characteristic curve 400 which represents approximate error percentage against the true value in the vertical axis and the relationship $f/f_0$ between harmonic wave f and the the fundamental wave frequency $f_0$ in the horizontal axis after substituting the corrective coefficients $K_1$ through $K_3$ into the approximate integration of the preceding equation (2-2) following the calculation of these corrective coefficients by executing a 6-point sampling operation at 30° of sampling interval $\theta$.

Likewise, in order to completely eliminate errors from the fundamental wave, double frequency, triple frequency, and the quadruple frequency by applying 8-point sampled values, since these sampled values are comprised of 8 points including $b_4$ through $b_1$ and $a_1$ through $a_4$, respectively, n=4 is substituted into n of the identical equation (2-5) and m=1 into m of the same when dealing with the fundamental wave, and as a result, the following equation is established.

$$\theta\{K_1 \cos(0.5\theta)+K_2\cos(1.5\theta)+K_3\cos(2.5\theta)+K_4\cos(3.5\theta)\} = 2\sin(0.5\theta)$$

When dealing with the double frequency, m=2 is substituted into m of the identical equation (2-5) to allow the following equation to be established.

$$\theta\{K_1 \cos(\theta)+K_2\cos(3\theta)+K_3\cos(5\theta)+K_4\cos(4\theta)\} = \sin(\theta)$$

When dealing with the triple frequency, m=3 is substituted into m of the expression (2-5) to allow the following equation to be established.

$$\theta\{K_1\cos(1.5\theta) + K_2\cos(4.5\theta) + K_3\cos(7.5\theta) + K_4\cos(10.5\theta)\} = \frac{2}{3}\sin(1.5\theta)$$

Likewise, when dealing with the quadruple frequency, m=4 is substituted into m of the expression (2-5) to allow the following equation to be established.

$$\theta\{K_1\cos(2\theta)+K_2\cos(6\theta)+K_3\cos(10\theta)+K_4\cos(14\theta)\}=0.5\sin(2\theta)$$

Consequently, values of the corrective coefficients K through $K_4$ can respectively be determined by working out those determinants shown below.

$$\begin{pmatrix} \cos(0.5\theta) & \cos(1.5\theta) & \cos(2.5\theta) & \cos(3.5\theta) \\ \cos(\theta) & \cos(3\theta) & \cos(5\theta) & \cos(7\theta) \\ \cos(1.5\theta) & \cos(4.5\theta) & \cos(7.5\theta) & \cos(10.5\theta) \\ \cos(2\theta) & \cos(6\theta) & \cos(10\theta) & \cos(14\theta) \end{pmatrix}\begin{pmatrix} K_1 \\ K_2 \\ K_3 \\ K_4 \end{pmatrix} =$$

-continued $$\frac{1}{\theta}\begin{pmatrix} 2\sin(0.5\theta) \\ \sin(\theta) \\ \frac{2}{3}\sin(1.5\theta) \\ 0.5\sin(2\theta) \end{pmatrix}$$

FIG. 11 also denotes the frequency characteristic curve 500 which represents approximate error percentage in the vertical axis occurring when the 8-point sampling operation is executed.

Accordingly, it is possible for the preferred embodiment of the second invention to thoroughly eliminate errors from extensive higher harmonic waves by establishing the equation (2-2) for integrating approximations and determining the corrective coefficients applicable to those equations cited above. In accordance with the equation (1-1) denoting the voltage relationship $$v = Ri + L(di/dt),$$

approximately integrated values generated from equations (2-6) and (2-7) during two different times can eventually be calculated.

These integrated values can be calculated from those equations shown below.

$$\int_{t_{n-1}}^{t_n} v\,dt = R \int_{t_{n-1}}^{t_n} i\,dt + L[i]\Big|_{t_{n-1}}^{t_n} \tag{2-6}$$

$$\int_{t_n}^{t_{n+1}} v\,dt = R \int_{t_n}^{t_{n+1}} i\,dt + L[i]\Big|_{t_n}^{t_{n+1}} \tag{2-7}$$

The preferred embodiment of the apparatus related to the invention securely calculates both the resistance component value R and the inductance component value L up to the faulty point present in the power system by working out the simultaneous equation derived from those equations (2-6) and (2-7) shown above, followed by substitution of the approximately integrated values calculated by the equation (1-1) into the integration terms shown below.

$$R = \frac{\int_{t_{n-1}}^{t_n} v\,dt [i]\Big|_{t_n}^{t_{n+1}} - \int_{t_n}^{t_{n+1}} v\,dt [i]\Big|_{t_{n-1}}^{t_n}}{\Delta}$$

$$L = \frac{\int_{t_n}^{t_{n+1}} v\,dt \int_{t_{n-1}}^{t_n} i\,dt - \int_{t_{n-1}}^{t_n} v\,dt \int_{t_n}^{t_{n+1}} i\,dt}{\Delta}$$

where $\Delta = \int_{t_{n-1}}^{t_n} i\,dt [i]\Big|_{t_n}^{t_{n+1}} - \int_{t_n}^{t_{n+1}} i\,dt [i]\Big|_{t_{n-1}}^{t_n}$ The foregoing descriptions in conjunction with the first and second embodiments of the inventions do not particularly distinguish between voltage and current. However, it is needless to mention that any conventional three-phase power system applies line-to-line voltage and line-to-line current to the short-circuit digital locator and also applies phase current compensating for the phase-voltage and zero-phase voltage to the ground digital locator, respectively.

In the light of advantageous features of the digital locator which may not necessarily determine both the resistance component value R and the inductance component value L up to the fault point as quickly as possible, the locator related to the invention may first store the voltage or current data in memory when the power system is out of order, and then, it calculates those values R and L by referring to those stored data later on.

Since it is rather important for the digital locator to improve the functional accuracy, use of a number of sampled values is not a critical problem. Also, it is needless to mention that the apparatus related to the invention can effectively be applied to any distance relay device by employing a number of sampled values within allowable range of operation time.

Furthermore, the locator related to the invention can also be used for generating scalar quantity of voltage and current.

As is clear from the above description, since the digital locator related to the invention provides corrective coefficients for dealing with error components present in high-frequency waves, the apparatus securely and significantly improves frequency characteristic of extensive frequencies including extremely high frequency bands.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A digital locator comprising:
voltage transforming means for transforming a voltage of a power system having a value "v" to a transformed voltage;
current transforming means for transforming a current of said power system having a value "i" to a transformed current;
a first filtering means connected to said voltage transforming means for eliminating restricted frequency bands in said transformed voltage;
a second filtering means connected to said current transforming means for eliminating restricted frequency bands in said transformed current;
means connected to said first and second filtering means for sampling the filtered transformed voltage and said filtered transformed current of said power system at an odd number of equal timewise intervals and converting the filtered transformed voltage to a digital voltage value representative of said value v and converting the filtered transformed current to a digital current value representative of said value i;
a first operation means for calculating the integration formula $$\int_{t_{n-1}}^{t_{n+1}} v\,dt = R \int_{t_{n-1}}^{t_{n+1}} i\,dt + L(i)\big|_{t_{n-1}}^{t_{n+1}}$$

of the equation $$v = Ri + L\frac{di}{dt}$$

expressing the relationship between a resistance value R and an inductance value L of a transmission line and the value v and the value i, for a series of sampling times $t_0, t_1 \ldots t_{n-1}, t_n, \ldots t_{n+1} \ldots t_{2n}$;
a second operation means for calculating the integration formula $$\int_{t_n}^{t_{n+2}} v\,dt = R \int_{t_n}^{t_{n+2}} i\,dt + L(i)\big|_{t_n}^{t_{n+2}}$$

of the equation $$v = Ri + L\frac{di}{dt};$$

a third operation means for approximating the integration formula $$\int_{t_{n-1}}^{t_{n+1}} f(t)\,dt$$

of said first and second operation means by the following approximating integration formula $$\int_{t_{n-1}}^{t_{n+1}} f(t)\,dt = \frac{K_1\theta}{2}\{f_{(t_{n-1})} + 2f_{(t_n)} + f_{(t_{n+1})}\} + \sum_{l=1}^{(N_0-1)} K_{l+1}l\theta\{f_{(t_{n+l})} + f_{(t_{n-l})}\}$$

where $K_1, K_2, \ldots$ respectively denote constants, $\theta$ denotes sampling angle, $f(t_{n-l}), \ldots f(t_n), \ldots f(t_{n+l})$ respectively denote momentary values of times $t_{n-l}, \ldots t_n, \ldots t_{n+l}$, and $N_o$ denotes an odd number of sampling values,
whereby said resistance value R and inductance value L of a transmission line up to a position where a fault point is present are obtained from said first, second and third operation means.

2. A digital locator comprising:
voltage transforming means for transforming a voltage of a power system having a value "v" to a transformed voltage;
current transforming means for transforming a current of said power system having a value "i" to a transformed current;
a first filtering means connected to said voltage transforming means for eliminating restricted frequency bands in said transformed voltage;
a second filtering means connected to said current transforming means for eliminating restricted frequency bands in said transformed current;
means connected to first and second said filtering means for sampling the filtered transformed voltage and said filtered transformed current of said power system at an even number of equal timewise intervals and converting the filtered transformed voltage to a digital voltage value representative of said value v and converting the filtered transformed current to a digital current value representative of said value i;

a first operation means for calculating the integration formula $$\int_{t_{n-1}}^{t_n} vdt = R \int_{t_{n-1}}^{t_n} idt + L(i)_{t_{n-1}}^{t_n}$$

of the equation $$v = Ri + L\frac{di}{dt} ;$$

expressing the relationship between a resistance value R and an inductance value L of a transmission line and the valve v and the value i, for a series of sampling times $t_0, t_1 \ldots t_{n-1}, t_n, t_{n+1} \ldots t_{2n-1}$;

a second operation means for calculating the integration formula $$\int_{t_n}^{t_{n+1}} vdt = R \int_{t_n}^{t_{n+1}} idt + L(i)_{t_n}^{t_{n+1}}$$

of the equation $$v = Ri + L\frac{di}{dt} ;$$

a third operation means for approximating the integration formula $$\int_{t_{n-1}}^{t_n} f(t)dt$$

of said first and second operation means by the following approximating integration formula $$\int_{t_{n-1}}^{t_n} f(t)dt = \frac{\theta}{2} \sum_{l=1}^{N_e/2} (2l - 1)K_l\{f_{(t_n-l)} + f_{(t_n+l-1)}\}$$

wherein $K_1, K_2, \ldots$ respectively denote constants, $\theta$ denotes sampling angle, $f(t_{n-l}), \ldots f(t_{n+l-1})$ respectively denote momentary values of times $t_{n-l} \ldots t_{n+l-1}$, and $N_e$ denotes an even number of sampling times; and whereby said resistance value R and inductance value L of a transmission line up to a position where a fault point is present are obtained from said first, second and third operation means.

* * * * *